United States Patent
Butler et al.

(10) Patent No.: US 8,619,232 B2
(45) Date of Patent: Dec. 31, 2013

(54) METHOD FOR DAMPING AN OBJECT, AN ACTIVE DAMPING SYSTEM, AND A LITHOGRAPHIC APPARATUS

(75) Inventors: Hans Butler, Best (NL); Marc Wilhelmus Maria Van Der Wijst, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 435 days.

(21) Appl. No.: 12/627,118

(22) Filed: Nov. 30, 2009

(65) Prior Publication Data

US 2010/0157264 A1    Jun. 24, 2010

Related U.S. Application Data (60) Provisional application No. 61/140,342, filed on Dec. 23, 2008.

(51) Int. Cl.
*G03B 27/54* (2006.01)

(52) U.S. Cl.
USPC ............................................................ 355/67

(58) Field of Classification Search
USPC ................................................ 355/67, 72, 75
See application file for complete search history.

(56) References Cited

U.S. PATENT DOCUMENTS

| | | | |
|---|---|---|---|
| 5,478,043 A | 12/1995 | Wakui | |
| 6,128,552 A | 10/2000 | Iwai et al. | |
| 6,286,644 B1 * | 9/2001 | Wakui | 188/378 |
| 6,378,672 B1 * | 4/2002 | Wakui | 188/378 |
| 2002/0001082 A1 | 1/2002 | Akimoto et al. | |
| 2004/0008331 A1 * | 1/2004 | Cox et al. | 355/53 |

FOREIGN PATENT DOCUMENTS

| | | |
|---|---|---|
| JP | 02-044402 | 2/1990 |
| JP | 07-083276 | 3/1995 |
| JP | 09-190957 | 7/1997 |
| JP | 2003-148552 | 5/2003 |
| JP | 2007-184621 | 7/2007 |

OTHER PUBLICATIONS

Translation for JP 09-190957 published on Jul. 22, 1997.*
Japanese Office Action mailed Feb. 8, 2012 in corresponding Japanese Patent Application No. 2009-279995.
Search Report and Written Opinion in related Singapore application No. 200908484-9 mailed Jun. 10, 2011.
Taiwan Office Action dated May 10, 2012 in corresponding Taiwan Patent Application No. 098142097.

* cited by examiner

*Primary Examiner* — Glen Kao
(74) *Attorney, Agent, or Firm* — Pillsbury Winthrop Shaw Pittman LLP (57) ABSTRACT

A method for damping an object in two or more degrees of freedom, including measuring a position quantity at each of the two or more measurement locations; extracting from the measured position quantities a measurement signal for each dynamic mode; feeding the measurement signal of a dynamic mode to a controller unit associated with the respective dynamic mode, the controller unit providing for each dynamic mode an output signal on the basis of the respective measurement signal; and providing a control signal to each of the two or more actuators, the control signal for each actuator being based on output signals of one or more controller units.

16 Claims, 9 Drawing Sheets

METHOD FOR DAMPING AN OBJECT, AN ACTIVE DAMPING SYSTEM, AND A LITHOGRAPHIC APPARATUS

CROSS REFERENCE TO RELATED APPLICATIONS

This application claims priority and benefit under 35 U.S.C. §119(e) to U.S. Provisional Patent Application No. 61/140,342, entitled "A Method For Damping An Object, An Active Damping System, and A Lithographic Apparatus", filed on Dec. 23, 2008. The content of that application is incorporated herein in its entirety by reference.

FIELD

The present invention relates to a method for damping an object, an active damping system and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus, a so-called metrology frame or metro frame is provided. This metrology frame is often used as a reference frame for movements of the patterning device supported on the patterning device support and the substrate supported on the substrate support. Furthermore, this metrology frame is used to support the projection system of the lithographic apparatus so that the projection system is held at a substantially stationary position with respect to the metro frame.

The metro frame is in the known lithographic apparatus supported by a base frame which is configured to be placed on an underground, for instance a floor. In order to avoid or at least decrease vibrations in the base frame, for instance originating from the floor or when an actuator of the patterning device support or the substrate support, is propagated to the metro frame, the metro frame is supported by an active damping system. The active damping system typically includes three air mounts between the base frame and the metro frame, each including an actuator to hold the metro frame at a desired position. Sensors are provided to measure a position quantity of the respective air mount, for instance position, velocity or acceleration.

Figure 1:
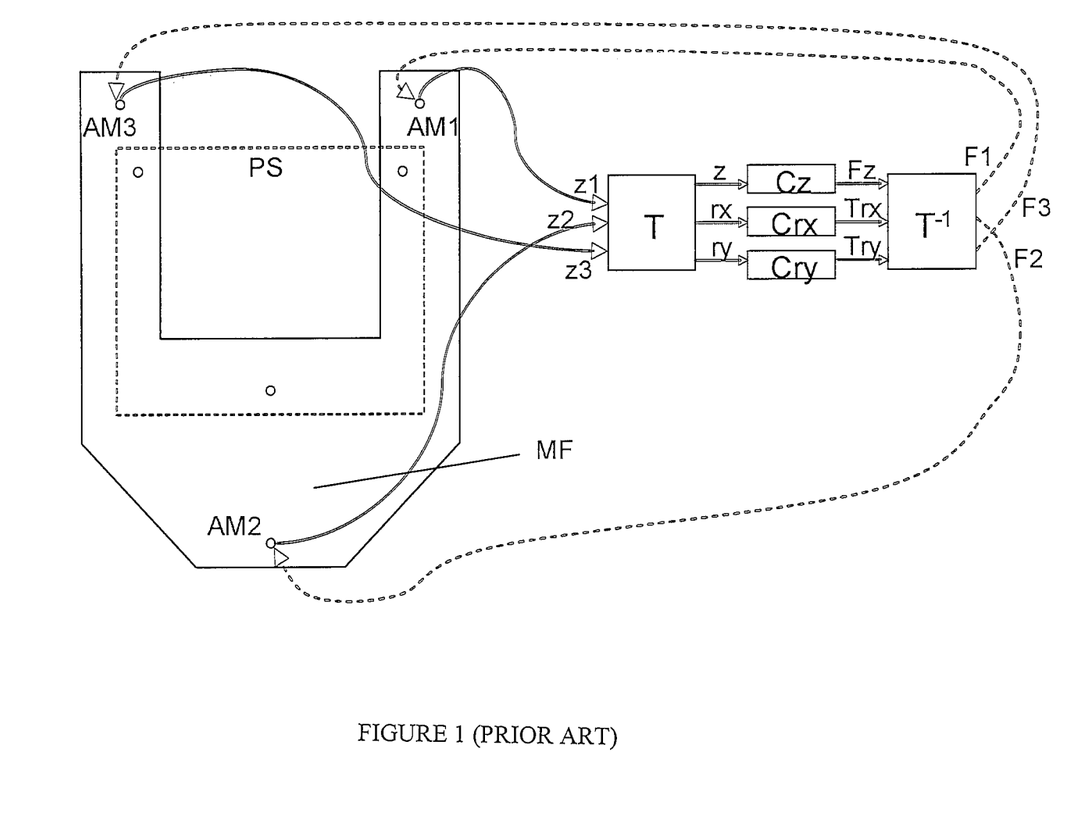
FIG. 1 depicts a prior art active damping system configured to damp a metro frame of a lithographic apparatus.

FIG. 1 shows a prior art active air mount system, including three active air mounts AM1, AM2, AM3 for a metro frame MF supporting a projection system PS. Each air mount includes at least one sensor to measure a position quantity of the respective air mount, for example a velocity. On the basis of these measurements (z1, z2, z3) a velocity of the projection system at three locations in substantially the same direction may be measured. By using a transformation device having transformation matrix T, the individual sensor signals can be decoupled into logical coordinates or degrees of freedom (z,Rx,Ry) with the center of gravity of the metro frame in combination with the objects supported by the metro frame as coordinate system origin.

For each logical coordinate, a controller device Cz, Crx, Cry, is provided which on the basis of the velocity in the respective logical coordinate provides a control signal Fz, Frx, Fry, for the respective directions. In a second transformation device an inverse transformation matrix $T^{-1}$ is provided to transform the control signals to actuator signals F1, F2, F3, for the respective actuators of the active air mount AM1, AM2, AM3.

In this way an active damping is created that allows damping of metroframe motion in at least the three indicated directions. An active damping system may also be configured to control a different number of degrees of freedom. For instance, by measuring a velocity in two directions in each air mount the projection system movements may be actively damped in six degrees of freedom. Usually, the damping is performed with respect to logical coordinates having the center of gravity of the metro frame in combination with the objects supported by the metro frame as coordinate system origin. Other origin locations are also possible. When the velocity is measured in an absolute fashion, i.e. with respect to the fixed world, as opposed to measuring it with respect to the base frame, this damping is also referred to as skyhook damping.

The skyhook damping performance is determined by its bandwidth. The bandwidth is limited by metro frame resonances. For example, lowest resonance frequency of a metrology frame of a known lithographic apparatus is as low as 150 Hz, as a result from limited available building space. To be able to create a high enough bandwidth to, for example, damp resonance modes around 30 Hz using the above described damping control system, the 150 Hz metroframe resonance should be dealt with.

In general, the metroframe resonance limits the performance of the skyhook damping, resulting in a limited reduction of overlay errors induced by metroframe motion.

SUMMARY

It is desirable to provide a method for damping an object supported by two or more active mounts, and an active damping system for damping an object, in which damping performance, in particular the bandwidth of the damping control system, may be improved.

According to an embodiment of the invention, there is provided a method for damping an object in two or more degrees of freedom, including providing a multivariable control system, including a position quantity measurement system to measure a position quantity at two or more measurement locations; a controller device configured to provide a control signal to two or more actuators mounted to the object on the basis of the measured position quantities, the controller device including: an extraction device to extract for at least one degree of freedom from the measured position quantities a measurement signal for two different dynamic modes of the object, and a controller unit for each dynamic mode, the control signal for the two or more actuators being based on output signals of the controller units of each dynamic mode of at least one degree of freedom, measuring a position quantity at each of the two or more measurement locations; extracting from the measured position quantities a measurement signal for each dynamic mode, feeding the measurement signal of a dynamic mode to a controller unit of the controller device associated with the respective dynamic mode, the controller unit providing for each dynamic mode an output signal on the basis of the respective measurement signal, providing a control signal to the two or more actuators, the control signal being based on output signals of one or more controller units.

According to an embodiment of the invention, there is provided an active damping system to damp an object in two or more degrees of freedom, including: two or more actuators connected to the object; a position quantity measurement system to measure at two or more measurement locations a position quantity of the object; and a multivariable control system, including a controller device configured to provide a control signal to the two or more actuators on the basis of the measured position quantity, wherein the controller device includes: an extraction device to extract for at least one degree of freedom from the measured position quantities a measurement signal for two different dynamic modes of the object, and a controller unit for each dynamic mode and for each degree of freedom, the control signal for at least one of the two or more actuators being based on output signals of the controller units of each dynamic mode of at least one degree of freedom.

According to an embodiment of the invention, there is provided a lithographic apparatus including: an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and an active damping system to damp an object in two or more degrees of freedom, including: two or more actuators connected to the object; a position quantity measurement system to measure at two or more measurement locations a position quantity of the object; and a multivariable control system, including a controller device configured to provide a control signal to the two or more actuators on the basis of the measured position quantity, wherein the controller device includes: an extraction device to extract for at least one degree of freedom from the measured position quantities a measurement signal for two different dynamic modes of the object, and a controller unit for each dynamic mode and for each degree of freedom, the control signal for at least one of the two or more actuators being based on output signals of the controller units of each dynamic mode of at least one degree of freedom.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6b depicts a Bode plot the rigid body mode measurement signal in the control scheme of FIG. 6a;

FIG. 6c depicts a Bode plot the bending mode measurement signal in the control scheme of FIG. 6a.

DETAILED DESCRIPTION

Figure 2:
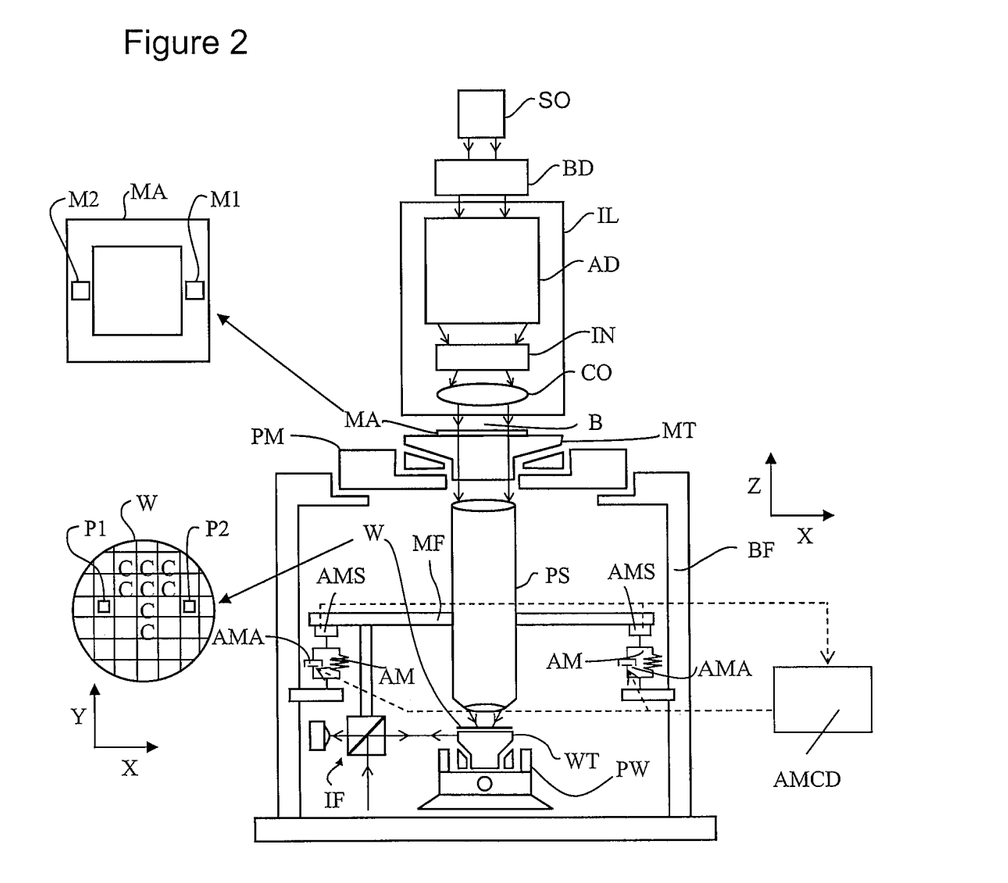
FIG. 2 depicts a lithographic apparatus incorporating an active damping system according to an embodiment of the invention.

FIG. 2 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 2, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 2) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the lithographic apparatus of FIG. 2 an active damping system (also broadly termed hereinafter an active damper) is provided between the base frame BF which is the main frame of the lithographic apparatus and the metrology frame or metro frame MF which supports the projection system PS. The metro frame MF is also used as a reference frame for movements of the lithographic apparatus. Therefore, it is desirable that vibrations in the base frame BF are not propagated to the metro frame MF. For this reason the metro frame MF is supported on the base frame BF with an active damping system including three air mounts AM. Each air mount AM includes an air mount sensor AMS configured to measure a position quantity of the metro frame, for instance a position, velocity or acceleration, and an air mount actuator AMA, configured to exert a force between the metro frame MF and the base frame BF to compensate for forces or vibrations coming from the base frame BF.

An air mount controller AMCD is provided to provide actuator signals to each of the actuators AMA on the basis of the measured position quantities of the air mount sensors AMS.

As discussed with respect to FIG. 1, the air mount controller AMCD may be a multivariable controller including a transformation device to transform a measured position quantity in a measurement direction to a degree of freedom in logical coordinates. For each degree of freedom a controller unit is provided which provides a control signal on the basis of the measured position quantity. To transform the control signal for the respective degree of freedom (z, Rx, Ry), to actuation directions of the air mount actuators AMA, a transformation device including a transformation matrix may be provided.

In an embodiment according to the invention, an alternative multivariable controller is provided. Instead of using the conventional logical coordinates (z, Rx, Ry) extracted from the measurements of the three air mount sensors AMS, more than three measurement signals are extracted from the position quantity measurements, each measurement signal representing a specific dynamic mode of the metro frame, for instance a rigid body mode or a bending mode, as will be explained.

Figure 3:
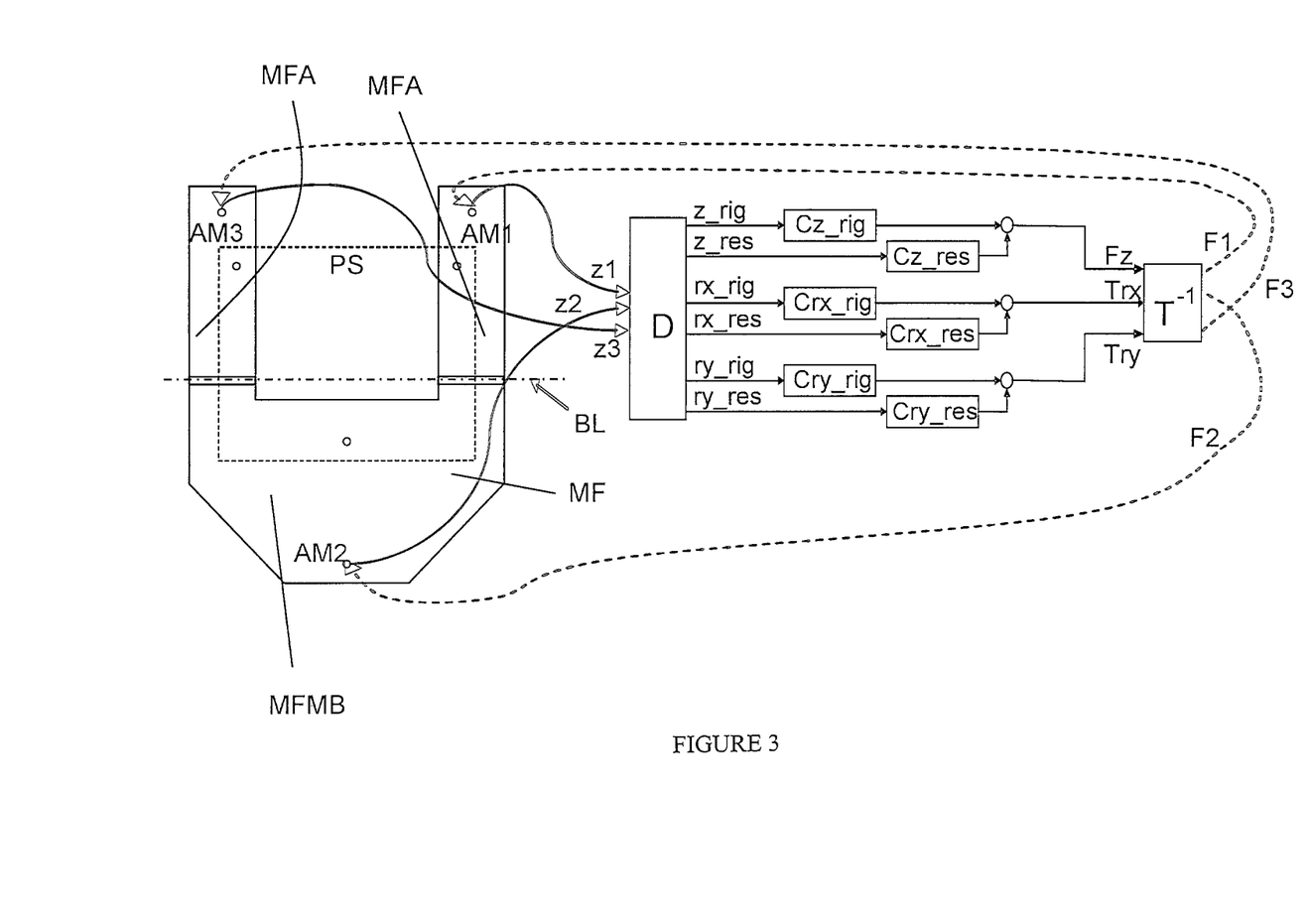
FIG. 3 depicts an active damping system according to an embodiment of the invention.

FIG. 3 shows a control system or controller according to such embodiment of the invention. In FIG. 3, it can be seen that the metroframe is U-shaped having a main body MFMB and two arms MFA. The arms MFA are not infinitely stiff coupled to the metroframe main body MFMB, but have a rotation mode around the indicated bending lines BL. The behavior of such a metro-frame may be described in different dynamic modes, for instance a rigid body mode and a bending mode. The rigid body mode only observes rigid body movements of the object. Resonances within the object are not observed in this mode. The bending mode does not observe rigid body movements of the object, but only resonance or other movements caused by flexibility within the object.

According to an embodiment of the invention, for each degree of freedom, measurement signals representing one of these dynamic modes may be extracted from the measured position quantities. By providing a controller unit for each of these measurement signals representing a specific dynamic mode, and dedicating this controller unit to the dynamic mode it controls, movements or vibrations can be controlled more accurately.

In FIGS. 4-7 the extraction of two measurement signals from the measured position quantities will be explained, in particular the rigid body mode and the bending mode associated with the rotation about the x-axis Rx. In a similar way, measurement signals may be extracted and controlled for other degrees of freedom of the object supported by the active damping system.

Figure 4:
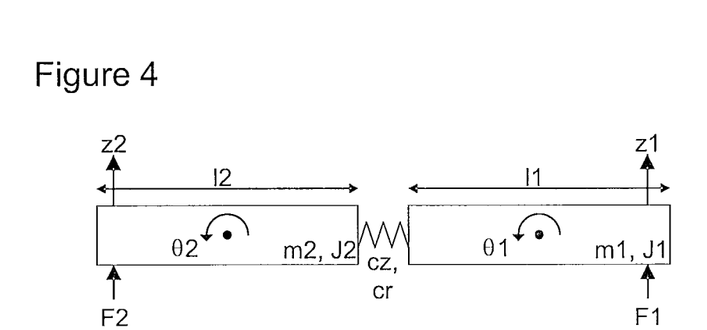
FIG. 4 depicts a model of the metro frame.

FIG. 4 shows a schematic side view of a model of the metro frame MF. Two body parts (1, 2) are connected through a rotational spring with stiffness cr and a very large vertical stiffness cz. Mass m2 represents the mass of the main body MFMB, in this example 1500 kg. m1 represents a mass of a metro frame arm, of for instance 500 kg. Actuating a torque on this structure by using actuators 1 and 2 generating an equal force in opposite direction (F1=−F2) will result in a Rx motion, which is determined by $$Rx = \frac{(z_1 - z_2)}{(l_1 + l_2)}.$$

Figure 5:
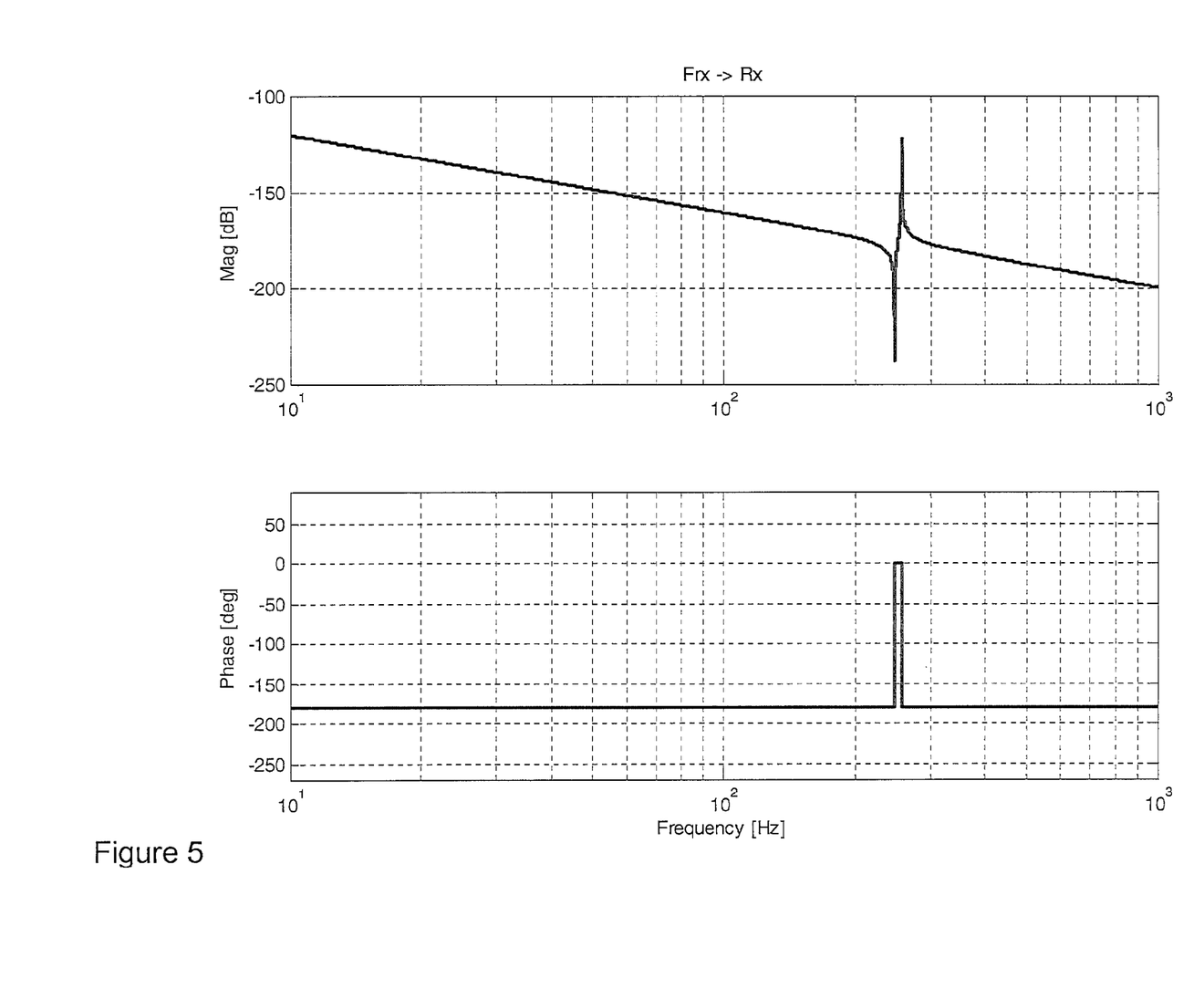
FIG. 5 depicts a Bode plot of the relation between a torque Frx being exerted on a metro frame and a resulting movement in the same direction Rx.

The transfer function from torque to Rx position is shown in FIG. 5. A bending mode resonance is observed, in this example, around 250 Hz. In practice, the phase behavior around this resonance frequency will be such that closed-loop stability at this point is endangered. This may be caused by phase behavior of components in the control loop, like amplifier and sensor characteristics, and phase lag induced by a discrete implementation of the controller in a digital computer.

Figure 6A:
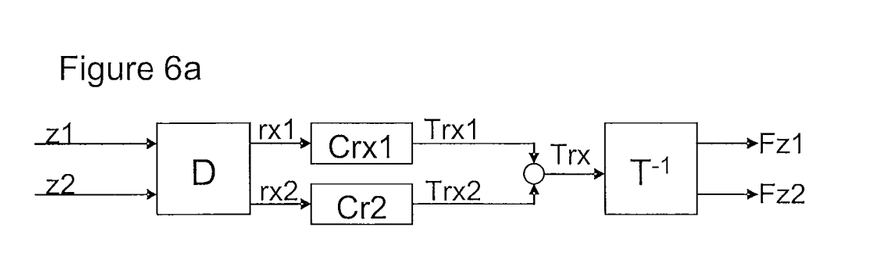
FIG. 6a depicts a control scheme for one degree of freedom according to an embodiment of the invention.
Figure 6B:
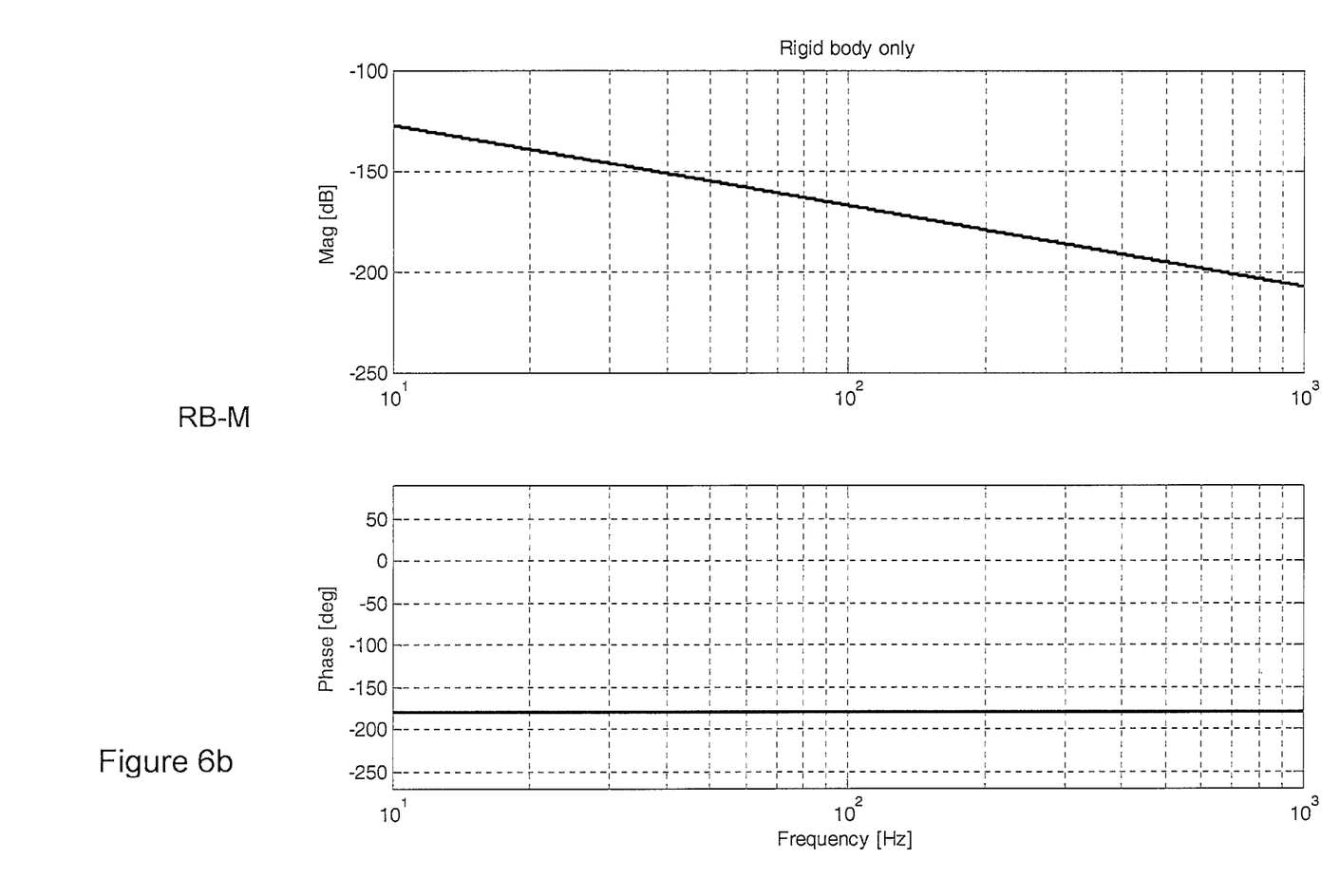
Figure 6C:
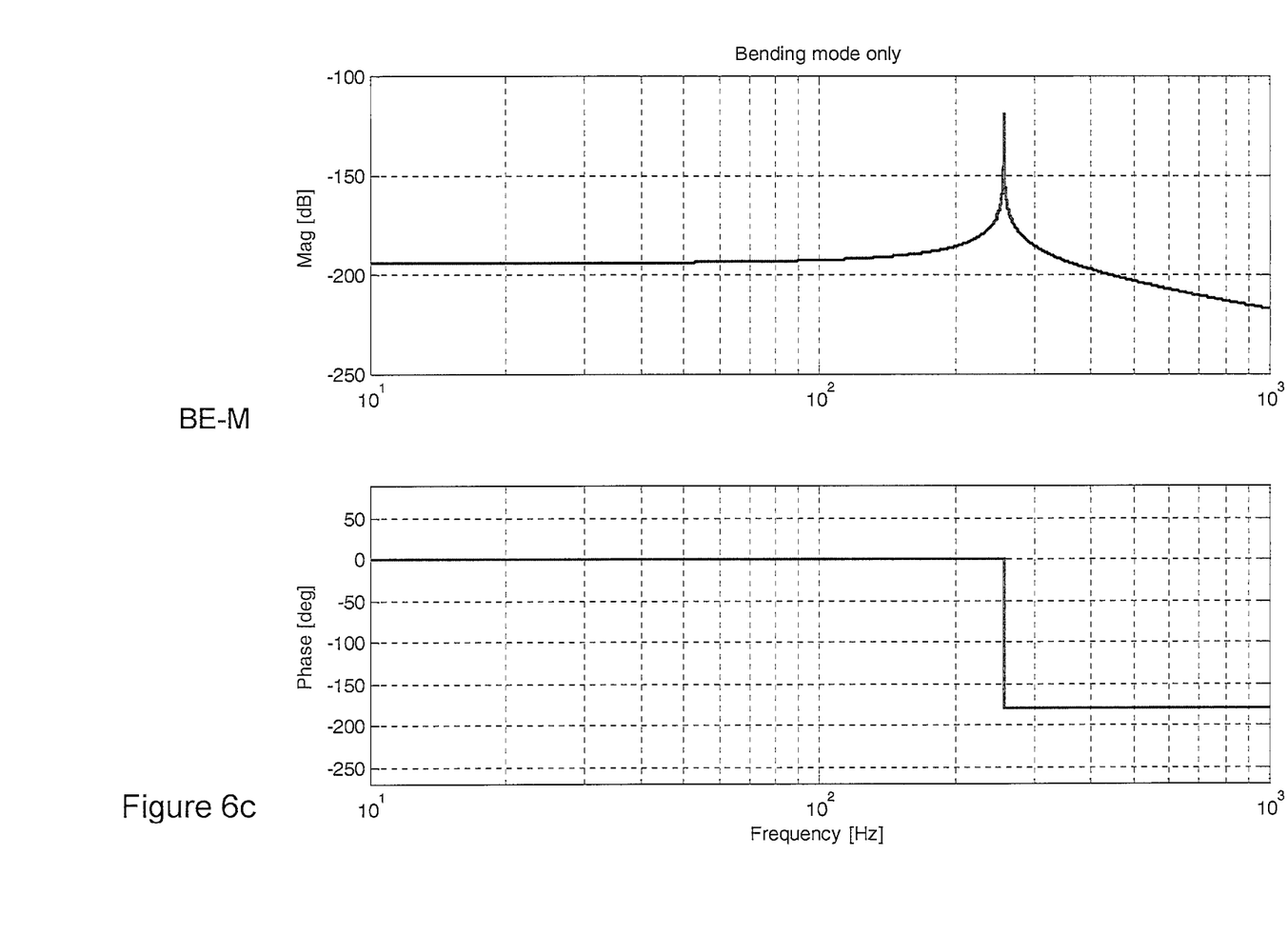

Now as shown in FIG. 6a, a measurement signal Rx1 for the rigid body mode and a measurement signal Rx2 for the bending mode may be extracted from the measured position quantities z1, z2. FIG. 6b, shows a Bode plot RB-M of the measurement signal Rx1 representing the rigid body mode, and FIG. 6c shows a Bode plot BE-M representing the bending mode dynamics. From this Bode plots it can be seen that the resonance is not present in the rigid body mode.

For each of these measurement signals Rx1, Rx2, a separate controller unit, Crx1 and Crx2 is provided. Each of these controller units Crx1, Crx2 is dedicated to control the respective dynamic mode and provides an output signal Trx1, Trx2. The output signals Trx1 and Trx 2 are added to provide a control signal Trx for the respective degree of freedom, in this case Rx. The control signal Trx is sent to the transformation $T^{-1}$, which calculates the forces Fz1 and Fz2 to be actuated by the air mount actuators AMA in order to damp the movement in the Rx degree of freedom. It is noted that the controller may provide further actuation signals to dampen movements of the metro frame MF in other degrees of freedom (as shown in FIG. 3).

Figure 7:
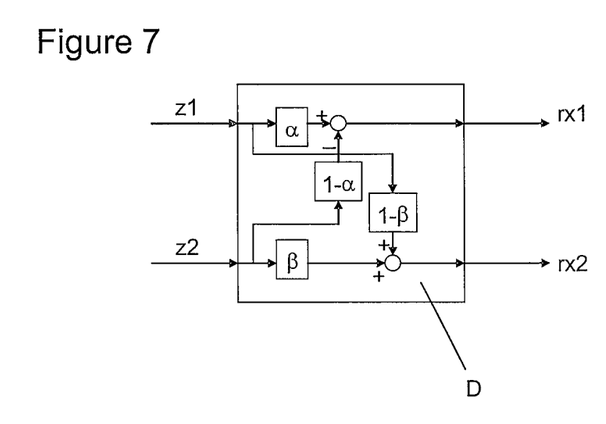
FIG. 7 depicts extraction matrix D configured to extract from the measured positions z1, z2 of two air mounts a measurement signal rx1, rx2 for two different dynamic modes.

The extraction device or extractor D providing the measurement signals Rx1 and Rx2, can be constructed by using combinations of z1 and z2, as shown in FIG. 7. The rigid-body mode can for example be extracted by using $rx_1 = \alpha z_1 - (1-\alpha)z_2$. The factor $\alpha$ is based on the model parameters; for the embodiment of the metro frame MF shown in FIG. 3, $\alpha = 0.35717271071802$. Effectively, the rigid-body rotation around a specific point is used, such that the bending mode is 'invisible'. It is remarked that if m1=m2, α=0.5.

One way to find α is the following. The equations of motion of the system, describing the relation between the torque on the system (F1-F2) with the measurement $rx_1 = \alpha z_1 - (1-\alpha)z_2$ can be determined mathematically. This transfer function has poles of which the position coincides with the modes of the system. Typically, since a position measurement is considered, a constant torque will lead to a constant acceleration of Rx. Thus there will be 2 poles are at the origin, and two poles are at the resonance frequency as shown in FIG. 5. Further, the transfer function has zeros of which the position is dependent on α. Now, a value of α is selected such that the location of the zeros matches that of the poles at the resonance frequency. This way, the zeros cancel the poles, and hence the resonance behaviour is no longer present. This calculation can for instance be done mathematically, creating a formula that is dependent on model parameters like masses, inertia's, connection stiffness, etc.

The bending mode measurement signals are extracted by using a weighed sum of z1 and z2: $rx_2 = \beta z_1 + (1-\beta)z_2$. The factor β is selected such that the rigid-body mode is not visible, i.e. a torque on the structure will not lead to a rigid-body acceleration in this direction. In the example above, β=⅜. A similar technique to find β can be used as described above for α. When applying a torque, the resonant mode will show opposite rotations of m1 with respect to m2. The rotation amplitude is however not the same, and depends on the geometry, mass and inertia of these masses. The optimum β is such that the z measurement of the component with the smaller rotation amplitude has a higher weight than the other z measurement. In our example, this leads to the optimal value of β=⅜.

Similar formulas may be used for extracting from the measured position quantities measurement signals for other degrees of freedom.

Now again referring to FIG. 3, FIG. 3 shows a control system configured to dampe movements of a metro frame MF in three degrees of freedom, z, Rx, Ry, wherein, for each degree of freedom, measurement signals for the rigid body mode and the bending mode are extracted from the measured position quantities.

Thus, in the controller of FIG. 3, two sets of measurement signals are used, the first set, z_rig, Rx_rig, Ry_rig, representing the rigid-body mode of the respective degree of freedom, and the second set z_res, Rx_res, Ry_res, representing the bending mode. The measurement signals, z_rig, Rx_rig, Ry_rig, z_res, Rx_res, Ry_res, are obtained by an extraction device D configured to extract these measurement signals from the measured position quantities z1, z2, and z3.

For each of these measurement signals, z_rig, Rx_rig, Ry_rig, z_res, Rx_res, Ry_res, a separate controller unit Cz_rig, Crx_rig, Cry_rig, Cz_res, Crx_res, Cry_res is provided. Each controller unit controls the respective dynamic mode of the respective degree of freedom. Each controller unit Cz_rig, Crx_rig, Cry_rig, Cz_res, Crx_res, Cry_res provides on the basis of the respective measurement signal z_rig, Rx_rig, Ry_rig, z_res, Rx_res, Ry_res, an output signal. In the embodiment shown in FIG. 3, the output signals of the rigid body mode controller unit Cz_rig, Crx_rig, Cry_rig and the bending mode controller unit Cz_res, Crx_res, Cry_res are added for each degree of freedom z, Rx, Ry resulting in a control signal Fx, Trx, Try, for each degree of freedom z, Rx, Ry.

A benefit of the control system of FIG. 3 is that by creating separate measurement signals from the same sensor set AMS and providing separate controller units for these measurement signals damping of relevant modes is possible without adding more physical sensors to the apparatus. In general, the damping controller bandwidth can be increased, resulting in less motion of the metro frame, and hence better overlay.

Hereinabove a control system to control a metro frame in three degrees of freedom has been described. An embodiment of the invention may also be applied in damping systems in which a different number of degrees of freedom is controlled. Further, the active damping system has been described to support a metro frame of a lithographic apparatus. An active damping system according to an embodiment of the invention may also be used for supporting and damping another object.

In the embodiment of FIG. 3, an extraction device has been used to extract measurement signals for two dynamic modes for each degree of freedom. Preferably, such extraction device is configured to provide measurement signal for two or more dynamic modes in each controlled degree of freedom. In alternative embodiments, it may however be possible to extract measurement signals for different dynamic modes for only a part of the controlled degrees of freedom. For instance, if a certain undesired resonance is mainly present in one degree of freedom, this degree of freedom may be controlled by controlling different dynamic modes of the respective object, while other degrees of freedom are only controlled by a single controller. In another embodiment, more than two dynamic modes for one degree of freedom may be determined in order to enhance control accuracy.

Hereinabove the damping of movements of a projection system supported by active mounts was described. Embodiments of the invention are however not limited to objects supported by active mounts. An embodiment of the invention can also be applied with sensors and actuators arranged at any suitable location on the object. The actuators may damp movements of the object by exerting forces on the object on the basis of the position quantities measured by the sensors.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for damping motion of an object in two or more degrees of freedom using a multivariable controller, the multivariable controller comprising a position quantity measurement system configured to measure a position quantity of the object at two or more measurement locations, a controller configured to provide a control signal to two or more actuators mounted to the object on the basis of the measured position quantity at the two more measurement locations, the controller comprising an extractor configured to extract for at least one degree of freedom from the measured position quantity at the two or more measurement locations a measurement signal for two different dynamic modes of the object, and a controller unit for each dynamic mode, the control signal for the two or more actuators being based on output signals of the controller units of each dynamic mode of at least one degree of freedom, the method comprising:

measuring the position quantity at each of the two or more measurement locations;

extracting, for each degree of freedom, from the measured position quantity at each of the two or more measurement locations a measurement signal for each of the two different dynamic modes;

for each of the two different dynamic modes of each said degree of freedom, supplying the measurement signal of a dynamic mode to a respective controller unit of the controller associated with the respective dynamic mode, the controller unit providing for each dynamic mode an output signal on the basis of the respective measurement signal; and providing the control signal to the two or more actuators, the control signal being based on output signals of one or more controller units.

2. The method of claim 1, wherein a first dynamic mode is a rigid body mode and a second dynamic mode is a bending mode of the object.

3. The method of claim 1, wherein providing the control signal to the two or more actuators comprises transforming control signals directed in a controlled direction into one or more actuation signals directed in actuation directions of the actuators.

4. The method of claim 1, wherein the object is a part of a lithographic apparatus.

5. The method of claim 1, wherein the multivariable controller is configured to provide a skyhook damping.

6. The method of claim 1, wherein the object is supported by two or more active mounts, each active mount comprising a position quantity sensor configured to measure a position quantity of the object at the measurement location and an actuator configured to exert a force on the object.

7. The method of claim 1, wherein the extractor is configured to extract for each controlled degree of freedom from the measured position quantity at the two or more measurement locations a measurement signal for two different dynamic modes of the object.

8. An active damping system configured to damp motion of an object in two or more degrees of freedom, the active damping system comprising:

two or more actuators connected to the object;

a position quantity measurement system configured to measure at two or more measurement locations a position quantity of the object; and a multivariable control system comprising a controller configured to provide a control signal to the two or more actuators on the basis of the measured position quantity at the two or more measurement locations, wherein the controller comprises an extractor configured to extract, for each degree of freedom, from the measured position quantity at the two or more measurement locations a measurement signal for each of two different dynamic modes of the object, and a controller unit for each dynamic mode of each said degree of freedom, the control signal for at least one of the two or more actuators being based on output signals provided by controller units of each dynamic mode of at least one degree of freedom.

9. The damping system of claim 8, wherein a first dynamic mode is a rigid body mode and a second dynamic mode is a bending mode of the object.

10. The damping system of claim 8, wherein the control system comprises a transformation device configured to transform control signals directed in a controlled direction into actuation signals directed in actuation directions of the actuators.

11. The damping system of claim 8, wherein the object is supported by two or more active mounts, each mount comprising a position quantity sensor configured to measure a position quantity and an actuator configured to exert a force on the object.

12. The damping system of claim 8, wherein the extractor is configured to extract for each controlled degree of freedom from the measured position quantities a measurement signal for two different dynamic modes of the object.

13. The damping system of claim 8, wherein the position quantity is a velocity of the object.

14. A lithographic apparatus comprising:

a support constructed to support a patterning device, the patterning device being capable of imparting a radiation beam with a pattern in its cross-section to form a patterned radiation beam;

a substrate table constructed to hold a substrate;

a projection system configured to project the patterned radiation beam onto a target portion of the substrate, and an active damping system to damp an object in two or more degrees of freedom, comprising two or more actuators connected to the object;

a position quantity measurement system to measure at two or more measurement locations a position quantity of the object; and a multivariable control system, comprising a controller configured to provide a control signal to the two or more actuators on the basis of the measured position quantity at the two or more measurement locations, wherein the controller comprises an extractor configured to extract, for each degree of freedom, from the measured position quantity at the two or more measurement locations a measurement signal for each of two different dynamic modes of the object, and a controller unit for each dynamic mode of each said degree of freedom, the control signal for at least one of the two or more actuators being based on output signals provided by controller units of each dynamic mode of at least one degree of freedom.

15. The lithographic apparatus of claim 14, wherein the object is a metrology frame configured to support the projection system.

16. The lithographic apparatus of claim 14, wherein a first dynamic mode is a rigid body mode and a second dynamic mode is a bending mode of the object.

* * * * *